US006185109B1

(12) United States Patent
Koradia et al.

(10) Patent No.: US 6,185,109 B1
(45) Date of Patent: Feb. 6, 2001

(54) ELECTRONIC CHASSIS APPARATUS AND METHOD

(75) Inventors: Amir Koradia, Palatine; Philip A. Ravlin, Bartlett; John J. Connell, Lake Zurich, all of IL (US)

(73) Assignee: 3Com Corporation, Rolling Meadows, IL (US)

( * ) Notice: Under 35 U.S.C. 154(b), the term of this patent shall be extended for 0 days.

(21) Appl. No.: 09/258,710

(22) Filed: Feb. 26, 1999

(51) Int. Cl.[7] .................................................. H05K 9/00
(52) U.S. Cl. .......................... 361/818; 361/796; 361/816; 361/752; 361/753; 361/800; 174/35 MS; 174/35 R
(58) Field of Search ..................................... 361/752, 753, 361/796, 799, 800, 756, 801, 802, 816, 818; 174/35 R, 35 GC, 35 MS

(56) References Cited

U.S. PATENT DOCUMENTS

| 4,408,255 | * | 10/1983 | Adkins ................................. 361/382 |
|---|---|---|---|
| 5,012,041 | * | 4/1991 | Sims et al. ....................... 174/35 MS |
| 5,055,651 | * | 10/1991 | Schneider et al. .............. 219/121.68 |
| 5,239,125 | * | 8/1993 | Savage et al. ................... 174/35 MS |
| 5,367,309 | * | 11/1994 | Tashjian ................................. 343/702 |
| 5,650,922 | * | 7/1997 | Ho ......................................... 361/799 |
| 5,856,632 | * | 1/1999 | Bostrom et al. ................. 174/35 GC |
| 5,929,376 | * | 7/1999 | Doun et al. .......................... 174/35 R |
| 6,007,169 | * | 12/1999 | Li et al. .............................. 312/223.2 |
| 6,058,025 | * | 5/2000 | Ecker et al. .......................... 361/816 |

\* cited by examiner

Primary Examiner—Jayprakash N. Gandhi
Assistant Examiner—Tuan Dinh
(74) Attorney, Agent, or Firm—Baniak Pine & Gannon

(57) ABSTRACT

An electronic chassis includes a first card guide attached to the electronic chassis. The first card guide includes a plurality of openings formed therein. The first card guide further includes a channel positioned between each of the plurality of openings to receive a plurality of circuit boards. A first electromagnetic interference (EMI) shielding screen is positioned adjacent the first card guide. An air filter is positioned within the electronic chassis, and is spaced-apart from the EMI shielding screen to allow room air to flow through the air filter and to allow filtered air to be distributed along the plurality of openings.

11 Claims, 2 Drawing Sheets

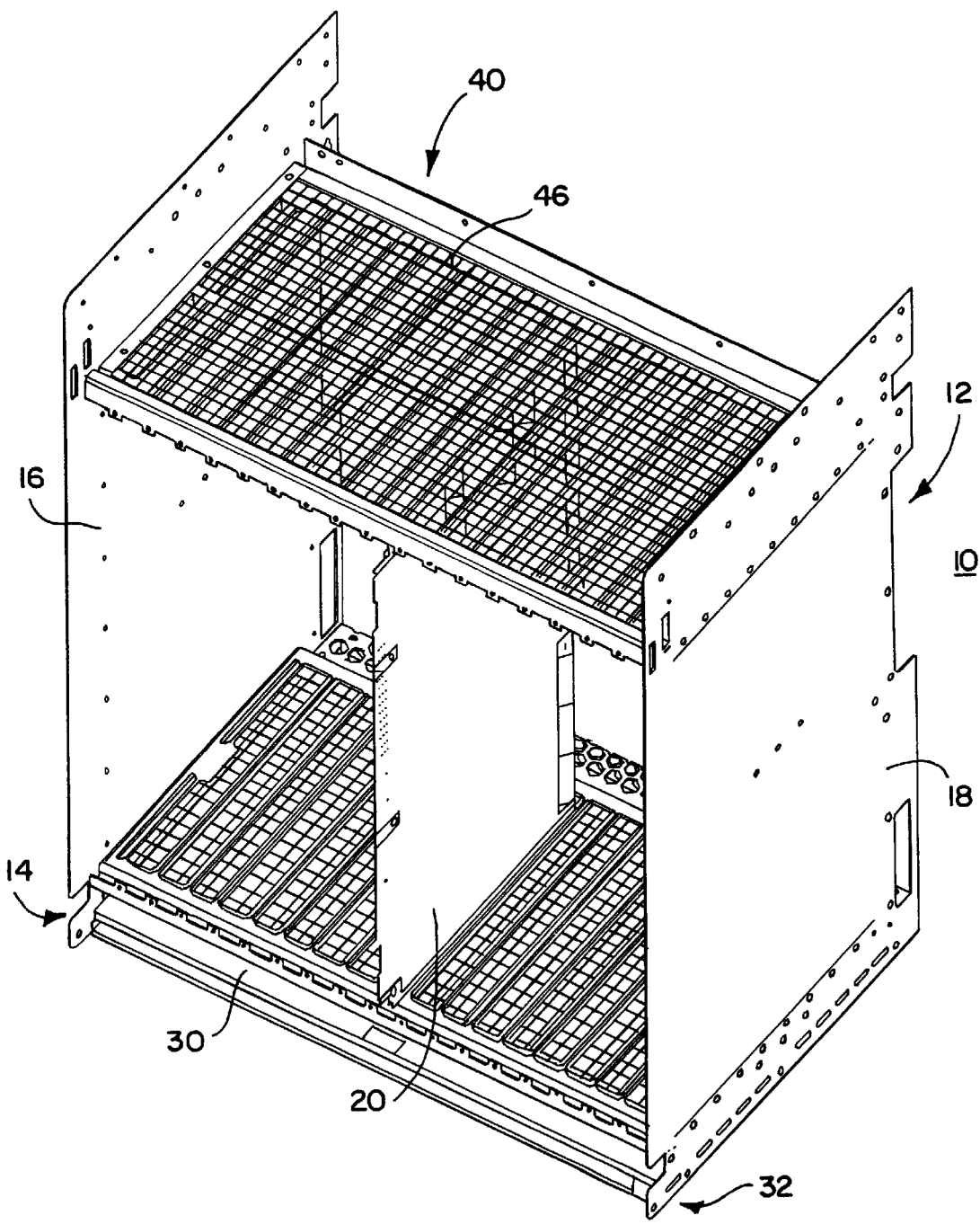

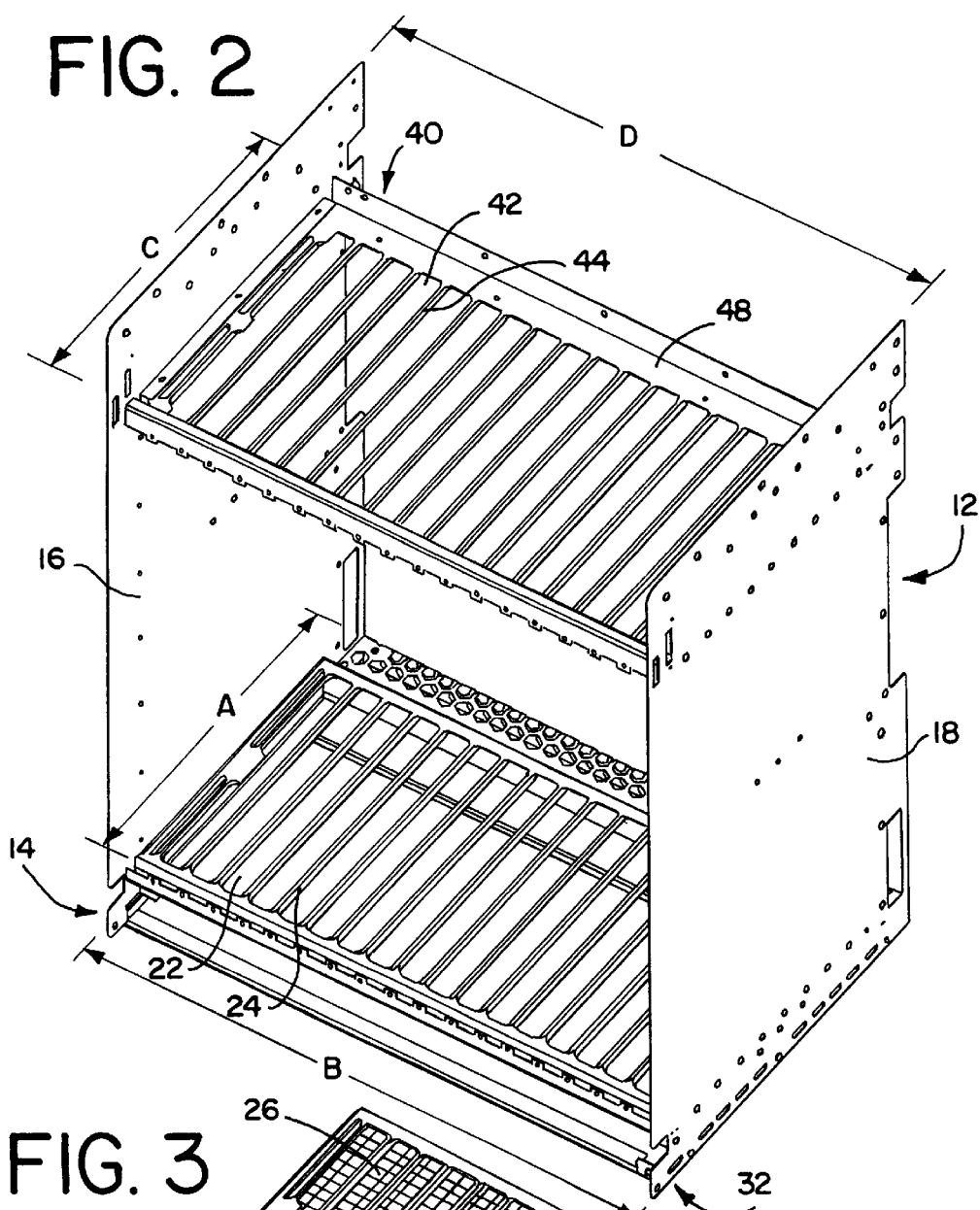
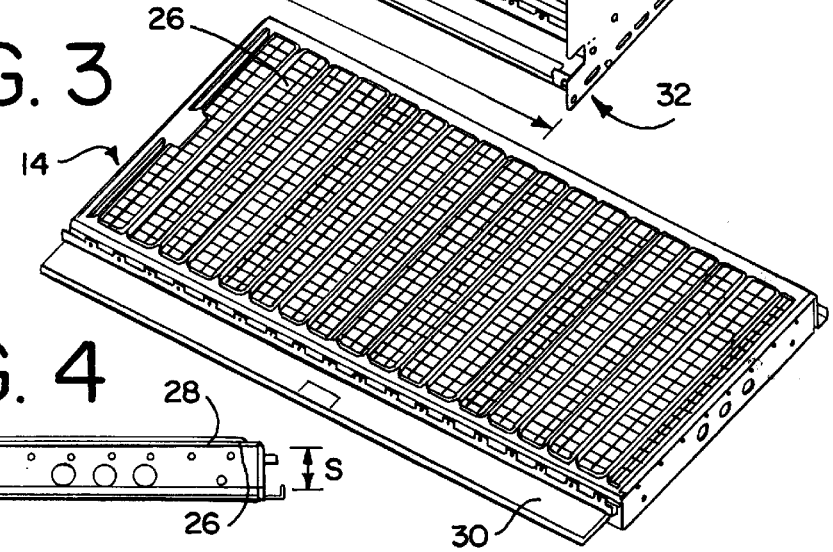
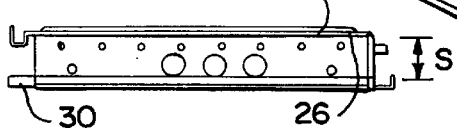

ELECTRONIC CHASSIS APPARATUS AND METHOD

FIELD OF THE INVENTION

This invention relates generally to the field of electronic chassis that house electronic components such as, for example, electronic components for high speed telecommunication and networking applications.

BACKGROUND OF THE INVENTION

Electronic chassis which house electronic components for high speed telecommunication and networking applications typically include two card guides mounted between side walls of the chassis, one located adjacent the top of the chassis and the other located adjacent the bottom of the chassis. The card guides receive and support a plurality of vertically oriented circuit boards that are typically inserted into the chassis in between the two card guides. Conventional card guides typically include small openings that allow some room air to flow through the chassis. Nonetheless, the design of conventional card guides typically restricts the amount of airflow through the chassis and therefore does not provide the required amount of cooling of the circuit boards within the chassis.

Moreover, conventional electronic chassis typically include an air filter that is positioned immediately below the bottom card guide. Fans located at the top of the chassis cause air to flow upward from the bottom of the chassis through the air filter. However, the air that flows through the filter and into the chassis is typically not evenly distributed along each of the circuit boards. This may result in overheating of some of the circuit boards within the chassis.

Finally, attempts have been made to provide electromagnetic interference (EMI) shields that are positioned along the top and the bottom of the chassis to prevent electromagnetic emissions from exiting the chassis. However, conventional EMI shields typically restrict the amount of airflow through the chassis.

Accordingly, it would be desirable to have an electronic chassis apparatus that overcomes the disadvantages described above.

SUMMARY OF THE INVENTION

One aspect of the invention provides an electronic chassis apparatus comprising an electronic chassis having a first card guide attached to the electronic chassis. The first card guide includes a plurality of openings formed therein and a plurality of channels to receive a plurality of circuit boards. Each of the plurality of channels is positioned adjacent to at least one of the plurality of openings. A first electromagnetic interference (EMI) shielding screen is positioned adjacent the first card guide. An air filter is positioned within the electronic chassis and is spaced-apart from the EMI shielding screen to allow room air to flow through the air filter and to allow filtered air to be distributed along the plurality of openings. The first electromagnetic interference (EMI) shielding screen may preferably be attached to a surface of the first card guide. The surface of the first card guide may preferably be a bottom surface of the first card guide. The first card guide may preferably include a width and a length, and the plurality of openings may preferably extend continuously along a substantial portion of the width of the first card guide. The air filter may preferably be positioned adjacent a bottom portion of electronic chassis. The electronic chassis may further include a second card guide positioned above the first card guide. The second card guide may preferably include a plurality of openings formed therein and a plurality of channels to receive the plurality of circuit boards. Each of the plurality of channels may preferably be positioned adjacent to at least one of the plurality of openings. The second card guide may preferably include a width and a length. The plurality of openings of the second card guide may preferably extend continuously along a substantial portion of the width of the second card guide. A second electromagnetic interference (EMI) shielding screen may preferably be positioned adjacent the second card guide and attached to a surface of the second card guide. The surface of the second card guide may preferably be the top surface of the second card guide.

Another aspect of the invention provides a method of operating an electronic chassis. An electronic chassis including a first card guide attached to the electronic chassis is provided. The first card guide includes a plurality of openings formed therein and a plurality of channels to receive a plurality of circuit boards. Each of the plurality of channels is positioned adjacent to at least one of the plurality of openings. A first electromagnetic interference (EMI) shielding screen is positioned adjacent the first card guide. An air filter is positioned within the electronic chassis and is spaced-apart from the EMI shielding screen. Room air flows through the air filter, and filtered air is distributed along the plurality of openings.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 1 is a perspective view of a preferred embodiment of an electronic chassis apparatus that is made in accordance with the invention;

FIG. 2 is a perspective view of the embodiment of FIG. 1 with the air filter and the first and second electromagnetic interference (EMI) shielding screens removed;

FIG. 3 is a perspective view of a preferred embodiment of a first card guide including an exploded view of the air filter; and FIG. 4 is a side view of the first card guide of FIG. 3 showing the air filter in the inserted position.

DETAILED DESCRIPTION OF THE PRESENTLY PREFERRED EMBODIMENTS

As shown in FIGS. 1–2, a preferred embodiment of an electronic chassis apparatus 10 includes an electronic chassis 12 including a first card guide 14 attached to the electronic chassis 12. The electronic chassis 12 may preferably be any suitable enclosure for housing various electronic components such as, for example, electronic components for high-speed telecommunication and networking applications. The electronic chassis 12 may preferably be comprised of steel, aluminum or any other suitable metallic material. As shown in FIGS. 1–2, the first card guide 14 may preferably extend between side walls 16,18 of the electronic chassis 12 adjacent a bottom portion of the electronic chassis 12. The first card guide 14 may preferably be comprised of any suitable rigid material such as, for example, steel, aluminum or any other suitable metallic material. The first card guide 14 supports a plurality of vertically oriented circuit boards (one of which is designated as circuit board 20 shown in FIG. 1) that are inserted into the electronic chassis 12.

As shown in FIG. 2, the first card guide 14 includes a plurality of openings 22 formed therein and a plurality of channels 24. Each of the plurality of channels 24 is positioned adjacent to at least one of the plurality of openings 22. In the embodiment shown in FIG. 2, for example, the plurality of channels 24 and the plurality of openings 22 are positioned in an alternating fashion along the first card guide 14. The plurality of channels 24 receive and support the plurality of vertically oriented circuit boards 20, and allow the circuit boards 20 to slide in and out of the electronic chassis 12. As shown in FIG. 2, the first card guide 14 may preferably include a width A and a length B. The plurality of openings 22 may preferably extend continuously along a substantial portion of the width A of the first card guide 14. As a result, the size of each of the plurality of openings 22 is maximized to allow a maximum volume of air to pass through the plurality of openings 22 to provide improved cooling of the circuit boards 20 within the electronic chassis 12.

As shown in FIG. 3, a first electromagnetic interference (EMI) shielding screen 26 is positioned adjacent the first card guide 14. The EMI shielding screen 26 may preferably be comprised of a square grid pattern that is 83% open. This has been found suitable to prevent excessive levels of electromagnetic interference generated within the electronic chassis 12 from exiting the electronic chassis 12, and yet still allows a proper amount of filtered air to pass through it into the electronic chassis 12. The EMI shielding screen 26 may preferably be comprised of any suitable metallic material for reducing the transmission of electromagnetic interference. As shown in FIG. 4, the first interference EMI shielding screen 26 may preferably be attached to a surface 28 of the first card guide 14. The surface 28 of the first card guide 14 may preferably be a bottom surface of the first card guide 14.

As shown in FIGS. 1 and 3–4, an air filter 30 is positioned within the electronic chassis 12, and is spaced-apart from the EMI shielding screen 26 to allow room air to flow through the air filter 30 and to allow filtered air to be distributed along the plurality of openings 22. As shown in FIG. 1, the air filter may preferably be positioned adjacent to a bottom portion 32 of electronic chassis 12. The function of the air filter 30 is to provide filtered air to the electronic chassis 12. The air filter 30 may also preferably straighten the flow of air as it passes through the air filter 30 to further improve the flow of air through the electronic chassis 12. The air filter 30 may be any of the commercially available air filters for filtering air, and may preferably include a foam material at its core.

As shown in FIG. 1, the electronic chassis 12 may further include a second card guide 40 attached to the electronic chassis 12 at a position above the first card guide 14. As shown in FIG. 1, second card guide 40 may preferably extend between side walls 16,18 of the electronic chassis 12 adjacent a top portion of the electronic chassis 12. The second card guide 40 may preferably be comprised of any suitable rigid material such as, for example, steel, aluminum or any other suitable metallic material. The second card guide 40 supports the plurality of vertically oriented circuit boards 20 that are inserted into the electronic chassis 12.

As shown in FIG. 2, the second card guide 40 includes a plurality of openings 42 formed therein and a plurality of channels 44. Each of the plurality of channels 44 is positioned adjacent to at least one of the plurality of openings 42. In the embodiment shown, for example, the plurality of channels 44 and the plurality of openings 42 are positioned in an alternating fashion along the second card guide 40. The plurality of channels 44 receive and support the plurality of vertically oriented circuit boards 20, and allow the circuit boards 20 to slide in and out of the electronic chassis 12. The second card guide 40 may preferably include a width C and a length D. The plurality of openings 42 may preferably extend continuously along a substantial portion of the width C of the second card guide 40. As a result, the size of each of the plurality of openings 42 is maximized to allow a maximum volume of air to pass through the plurality of openings 42 to provide improved cooling of the circuit boards 20 within the electronic chassis 12.

As shown in FIG. 1, a second electromagnetic interference (EMI) shielding screen 46 is positioned adjacent the second card guide 40. The EMI shielding screen 46 may preferably be comprised of a square grid pattern that is 83% open. This has been found suitable to prevent excessive levels of electromagnetic interference generated within the electronic chassis 12 from exiting the electronic chassis 12, and yet still allows a proper amount of filtered air to pass through it. The second EMI shielding screen 46 may preferably be comprised of any suitable metallic material for reducing the transmission of electromagnetic interference. The second EMI shielding screen 46 may preferably be attached to a surface 48 (see FIG. 2) of the second card guide 40. The surface 48 of the second card guide 40 may preferably be a top surface of the second card guide 40.

In operation, a fan (not shown) mounted adjacent the top of the electronic chassis 12 draws room air up from the bottom of the electronic chassis 12 and through the air filter 30. As shown in FIG. 4, the filtered air then enters the space S between the air filter 30 and the EMI shielding screen 26. This space S allows the filtered air exiting the air filter 30 to be evenly distributed within the space S. As a result, the filtered air that passes through the EMI shielding screen 26 and through the plurality of openings 22 is evenly distributed along the plurality of openings 22. This improves the flow of air through the electronic chassis 12 and ensures that each of the circuit boards 20 in the electronic chassis 12 is properly cooled.

The filtered air then travels in an upward direction in the electronic chassis 12 between the vertically oriented circuit boards 20 within the electronic chassis 12. The filtered air then passes through the plurality of openings 42 in the second card guide 40, through the second EMI shielding screen 46, and out of the electronic chassis 12. The electronic chassis apparatus 10 described above provides effective EMI shielding, evenly distributes filtered air that enters the electronic chassis 12 to ensure uniform cooling of all of the circuit boards housed within the electronic chassis 12, and provides enhanced cooling by maximizing the volume of air to the electronic chassis 12.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An electronic chassis apparatus comprising:
an electronic chassis including a first card guide attached to the electronic chassis, the first card guide including a plurality of openings formed therein, the first card guide further including a plurality of channels to receive a plurality of circuit boards, each of the plurality of channels positioned adjacent to at least one of the plurality of openings, a first electromagnetic interference (EMI) shielding screen having a grid pattern positioned adjacent to the first card guide, the first electromagnetic interference (EMI) shielding screen covering the plurality of openings, and an air filter positioned within the electronic chassis and spaced-apart from the first electromagnetic interference (EMI) shielding screen to allow room air to flow through the air filter and to allow filtered air to be distributed along the plurality of openings.

2. The apparatus of claim 1 wherein the first electromagnetic interference (EMI) shielding screen is attached to a surface of the first card guide.

3. The apparatus of claim 2 wherein the surface of the first card guide is a bottom surface of the first card guide.

4. The apparatus of claim 1 wherein the first card guide includes a width and a length, the plurality of openings extending continuously along a substantial portion of the width of the first card guide.

5. The apparatus of claim 1 wherein the air filter is positioned adjacent a bottom portion of electronic chassis.

6. The apparatus of claim 1 wherein the electronic chassis further includes a second card guide, the second card guide positioned above the first card guide, the second card guide including a plurality of openings formed therein, the second card guide further including a plurality of channels to receive the plurality of circuit boards, each of the plurality of channels of the second card guide positioned adjacent to at least one of the plurality of openings of the second card guide.

7. The apparatus of claim 6 wherein the second card guide includes a width and a length, the plurality of openings of the second card guide extending continuously along a substantial portion of the width of the second card guide.

8. The apparatus of claim 6 further including a second electromagnetic interference (EMI) shielding screen having a grid pattern positioned adjacent to the second card guide, the second electromagnetic interference (EMI) shielding screen coving the plurality of openings of the second card guide.

9. The apparatus of claim 8 wherein the second electromagnetic interference (EMI) shielding screen is attached to a surface of the second card guide.

10. The apparatus of claim 9 wherein the surface of the second card guide is the top surface of the second card guide.

11. A method of operating an electronic chassis comprising:

provided an electronic chassis including a first card guide attached to the electronic chassis, the first card guide including a plurality of openings formed therein, the first card guide further including a plurality of channels to receive a plurality of circuit boards, each of the plurality of channels positioned adjacent to at least one of the plurality of openings, a first electromagnetic interference (EMI) shielding screen having a grid pattern positioned adjacent to the first card guide, the first electromagnetic interference (EMI) shielding screen covering the plurality of openings, and an air filter positioned within the electronic chassis and spaced-apart from the first electromagnetic interference (EMI) shielding screen;

flowing room air through the air filter; and distributing filtered air along the plurality of openings.

* * * * *